(12) United States Patent
Iljazi

(10) Patent No.: US 10,055,290 B2
(45) Date of Patent: *Aug. 21, 2018

(54) ACCELERATING SLICE TRANSFERS UTILIZING MULTIPLE INTERFACES

(71) Applicant: International Business Machines Corporation, Armonk, NY (US)

(72) Inventor: Ilir Iljazi, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 122 days.

This patent is subject to a terminal disclaimer.

(21) Appl. No.: 15/187,923

(22) Filed: Jun. 21, 2016

(65) Prior Publication Data

US 2017/0004042 A1    Jan. 5, 2017

Related U.S. Application Data

(60) Provisional application No. 62/186,590, filed on Jun. 30, 2015.

(51) Int. Cl.
*G11C 29/00* (2006.01)
*G06F 11/10* (2006.01)
(Continued)

(52) U.S. Cl.
CPC .......... *G06F 11/1076* (2013.01); *G06F 3/064* (2013.01); *G06F 3/065* (2013.01);
(Continued)

(58) Field of Classification Search
CPC .... G06F 11/1076; G06F 3/0619; G06F 3/064; G06F 3/067; G06F 3/065; G06F 11/1662;
(Continued)

(56) References Cited

U.S. PATENT DOCUMENTS 4,092,732 A    5/1978 Ouchi
5,454,101 A    9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Guy Lamarre
(74) *Attorney, Agent, or Firm* — Garlick & Markison; Timothy W. Markison; Shayne X. Short

(57) ABSTRACT

Based on a detected data transfer instruction, a computing device within a dispersed storage network (DSN) determines a data transfer synchronization protocol that substantially maintains synchronization of at least the write threshold number of first associated slices (e.g., a first row of encoded data slices) to be transferred from the first set of storage units (SUs) to a second set of SUs based on a substantially same first transfer rate and substantially maintains synchronization of at least the write threshold number of second associated slices (e.g., a second row of encoded data slices) to be transferred from the first set of SUs to the second set of SUs based on a substantially same second transfer rate. The computing device then executes the data transfer synchronization protocol to perform substantially synchronized transfer of respective sets of the plurality of sets of encoded data slices from the first set of SUs to the second set of SUs.

18 Claims, 8 Drawing Sheets

(51) Int. Cl.
*G06F 3/06* (2006.01)
*G06F 11/16* (2006.01)
*G06F 17/30* (2006.01)
*H03M 13/33* (2006.01)
*H04L 29/08* (2006.01)
*H04L 29/06* (2006.01)
*H03M 13/37* (2006.01)
*H03M 13/15* (2006.01)

(52) U.S. Cl.
CPC ............ *G06F 3/067* (2013.01); *G06F 3/0619* (2013.01); *G06F 11/1662* (2013.01); *G06F 17/3053* (2013.01); *G06F 17/30312* (2013.01); *G06F 17/30545* (2013.01); *G06F 17/30575* (2013.01); *G06F 17/30578* (2013.01); *H03M 13/33* (2013.01); *H03M 13/3761* (2013.01); *H04L 65/4076* (2013.01); *H04L 67/06* (2013.01); *H04L 67/1095* (2013.01); *H04L 67/1097* (2013.01); *H04L 67/16* (2013.01); *G06F 2201/805* (2013.01); *H03M 13/1515* (2013.01)

(58) Field of Classification Search
CPC ......... G06F 2201/805; G06F 17/30312; G06F 17/30545; G06F 17/30578; G06F 17/30575; G06F 17/3053; H03M 13/33; H04L 67/1097; H04L 67/06; H04L 65/4076; H04L 67/1095; H04L 67/16
See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,794,072 A * | 8/1998 | Nomura | G06F 13/4226 345/535 |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,859,866 B2 * | 2/2005 | Dahlen | G06F 11/1443 711/147 |
| 6,879,596 B1 | 4/2005 | Dooply | |
| 6,950,603 B1 * | 9/2005 | Isozaki | G11B 20/10527 360/22 |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0025142 A1 * | 2/2002 | Suh | G11B 20/1252 386/258 |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2003/0177321 A1 * | 9/2003 | Watanabe | G06F 11/2058 711/161 |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2008/0320260 A1 * | 12/2008 | Watanabe | G06F 11/2058 711/162 |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2013/0290486 A1 * | 10/2013 | Ishiyama | H04L 67/02 709/217 |
| 2017/0060685 A1 * | 3/2017 | Resch | G06F 3/0619 |
| 2017/0147428 A1 * | 5/2017 | Volvovski | G06F 11/10 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

(56) References Cited

OTHER PUBLICATIONS

Smith; Lightweight Directory Access Protocol (LDAP): String Representation of Search Filters; IETF Network Working Group; RFC 4515; Jun. 2006; pp. 1-12.
Zeilenga; Lightweight Directory Access Protocol (LDAP): Directory Information Models; IETF Network Working—Group; RFC 4512; Jun. 2006; pp. 1-49.
Sciberras; Lightweight Directory Access Protocol (LDAP): Schema for User Applications; IETF Network Working Group; RFC 4519; Jun. 2006; pp. 1-33.
Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

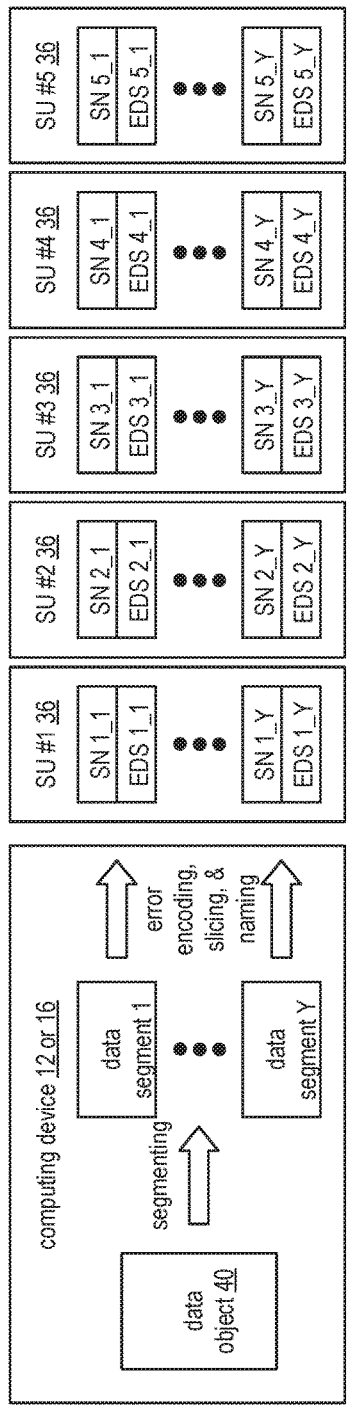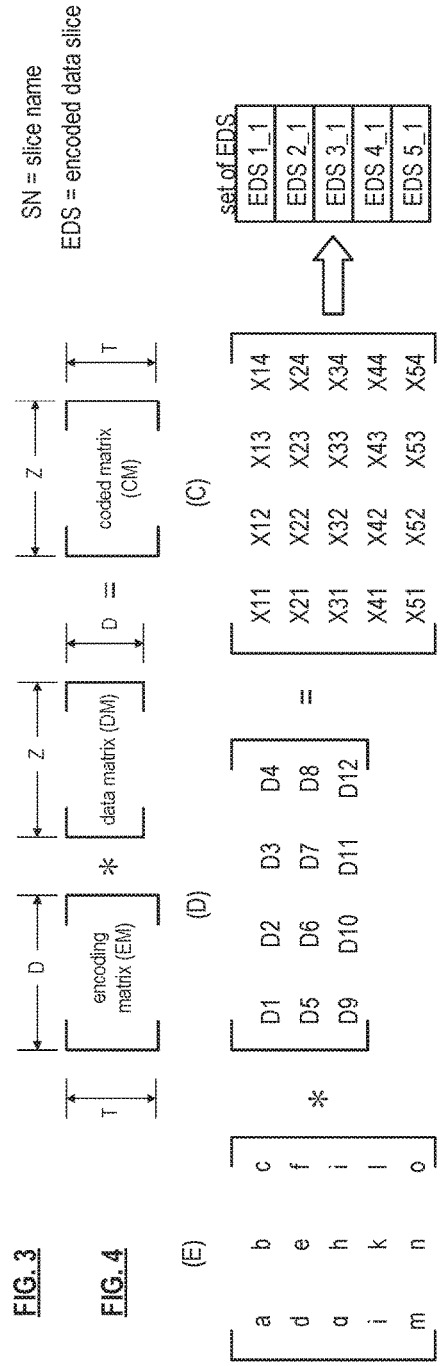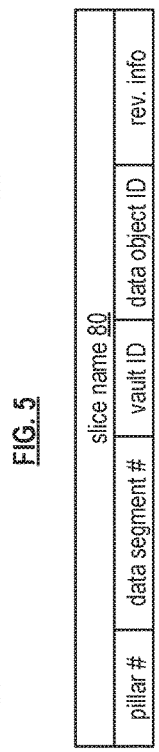

ACCELERATING SLICE TRANSFERS UTILIZING MULTIPLE INTERFACES

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Within data storage systems, there may be times when data may need to be transferred one of more storage units to one of more other storage units. For example, reasons for transferring date from one of more storage units to one of more other storage units can include storage unit evacuation, storage unit pool retirement, storage unit pool replacement, relocation of one or more storage unit, etc. The prior art does not provide an adequate means by which such data transfer may be made without deleteriously affecting the overall performance of the storage system.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
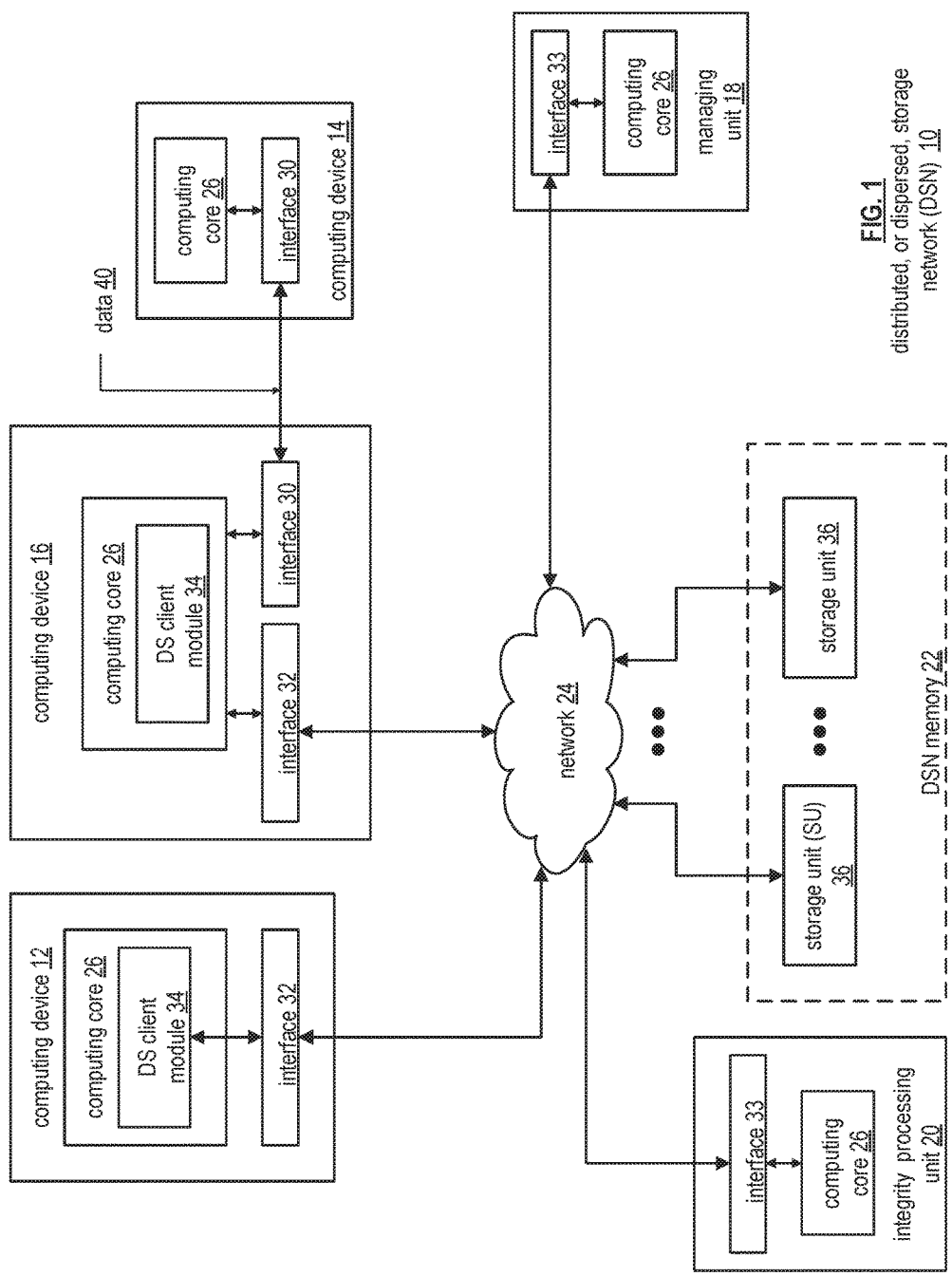
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
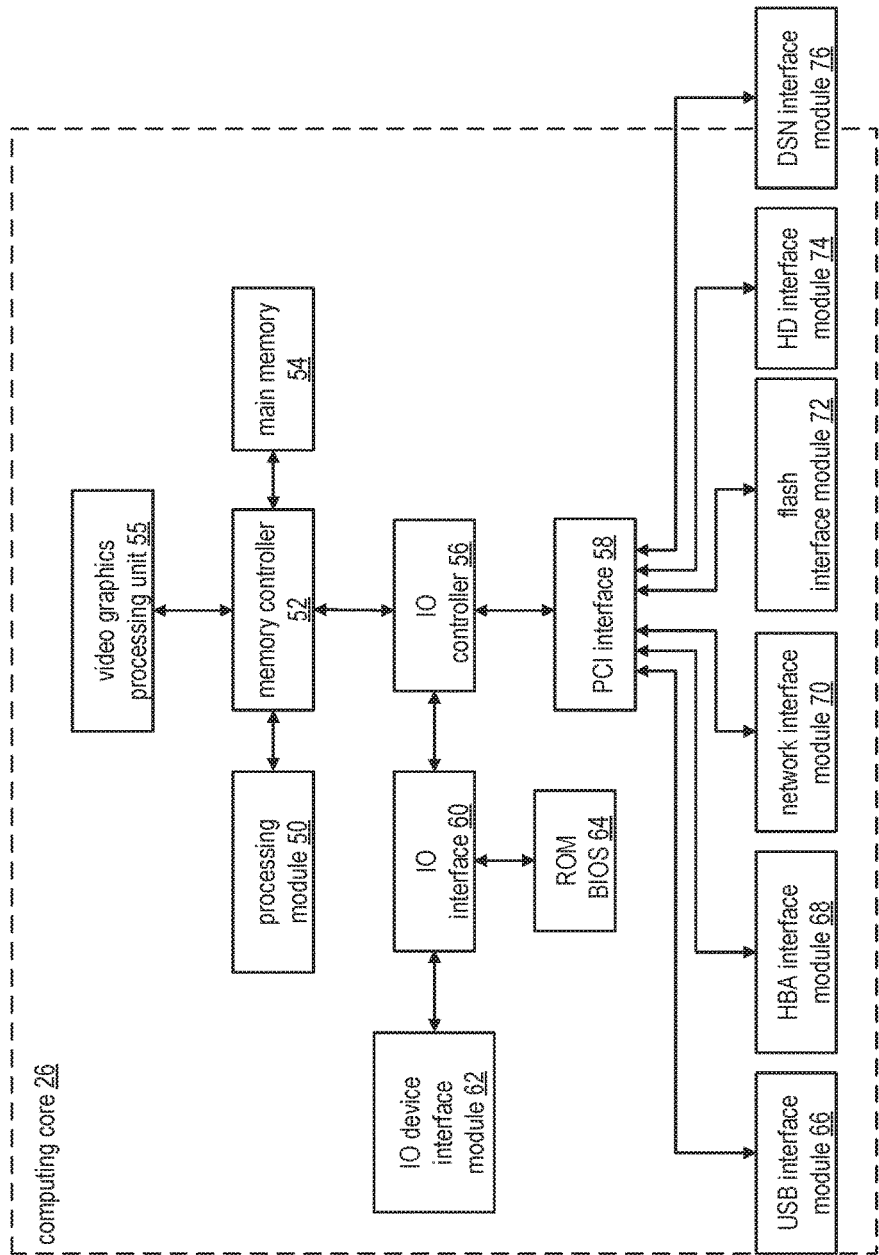
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a non-public vault and/or public vaults, which can be used to generate a per-access billing information. In another instance, the DSTN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), interne small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
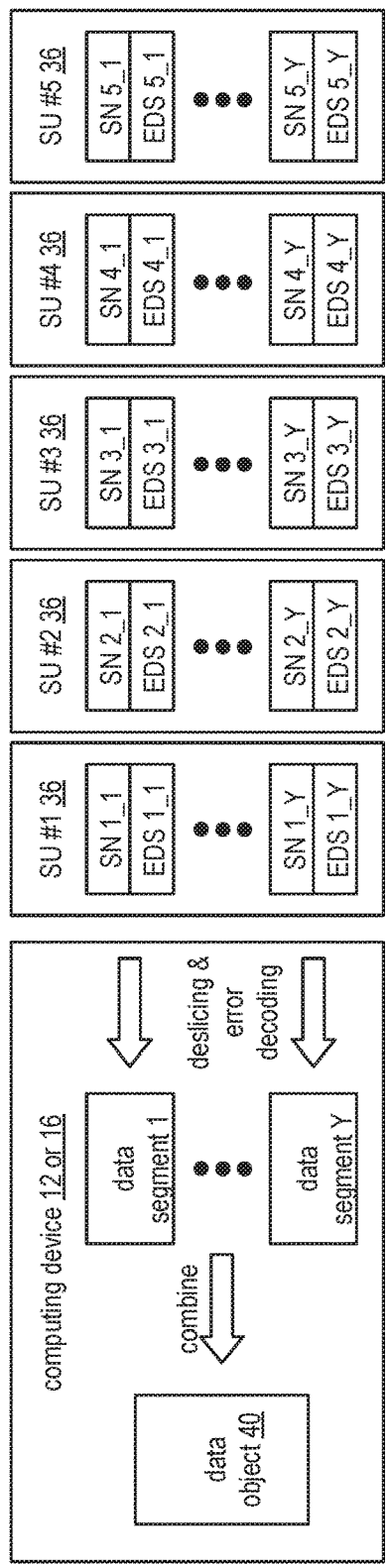
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
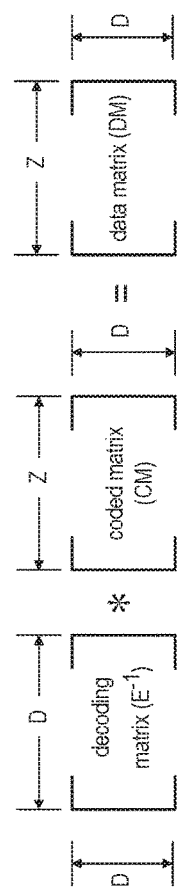
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
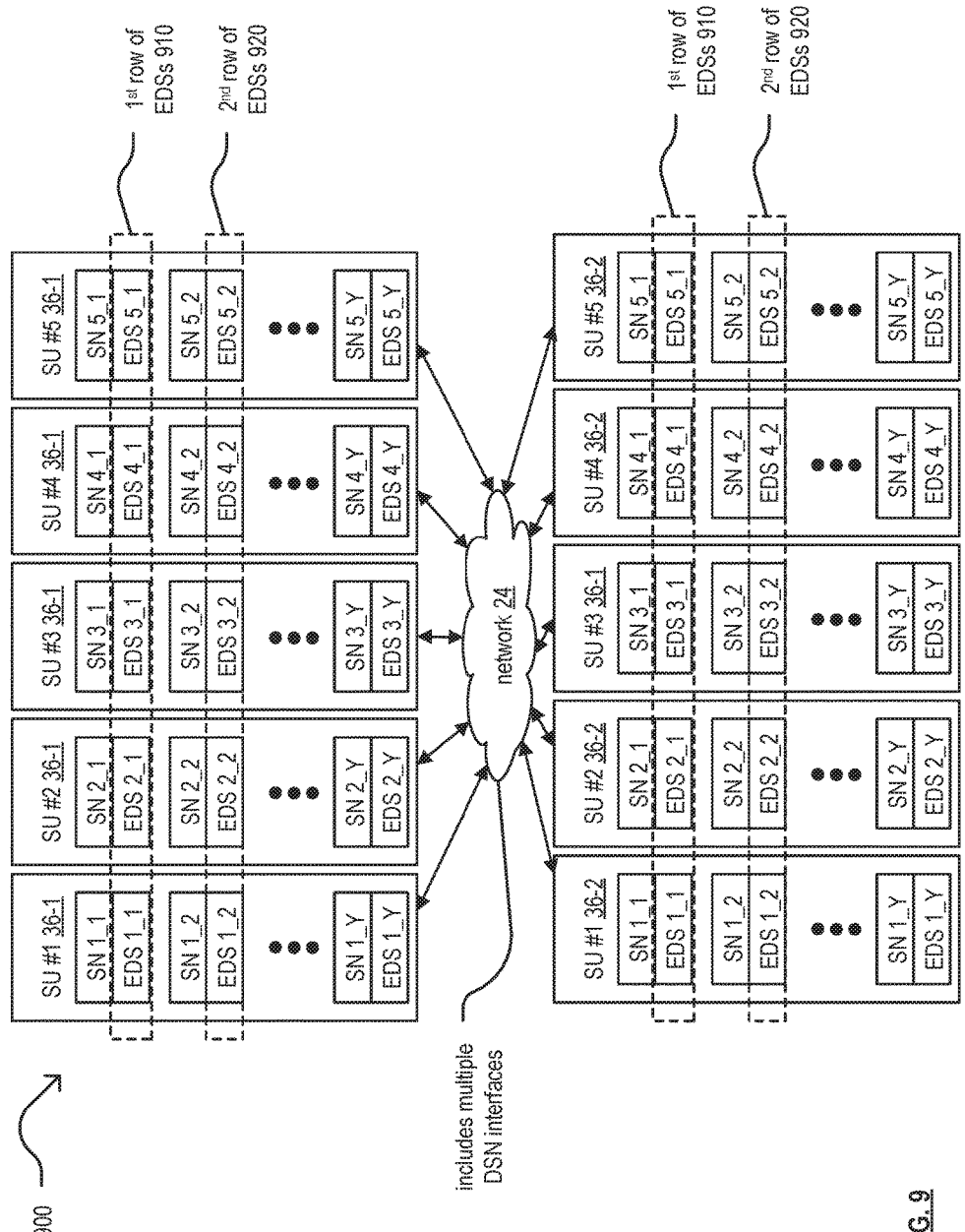
FIG. 9 is a schematic block diagram of an example of transfer of data from a first set of storage units (SUs) to another set of SUs in accordance with the present invention.

FIG. 9 is a schematic block diagram of an example 900 of transfer of data from a first set of storage units (SUs) to another set of SUs in accordance with the present invention. A first set of SUs (shown as SU #1 36-1, SU #2 36-1, SU #3 36-1, SU #4 36-1, and SU #5 36-1) includes information stored therein. For example, the first set of SUs includes one or more set of EDSs. For example, the first set of SUs includes a first group of EDSs (e.g., EDSs 1_1, EDSs 2_1, EDSs 3_1, EDSs 4_1, and EDSs 5_1) such as may be understood as corresponding to a first row of EDSs 910 that are based on a first data segment such as described with reference to FIG. 3. The first set of SUs also includes a second group of EDSs (e.g., EDSs 1_2, EDSs 2_2, EDSs 3_2, EDSs 4_2, and EDSs 5_2) such as may be understood as corresponding to a second row of EDSs 920 that are based on a second data segment such as described with reference to FIG. 3. The first set of SUs may also any number of additional groups of EDSs (e.g., EDSs 1_Y, EDSs 2_Y, EDSs 3_Y, EDSs 4_Y, and EDSs 5_Y) such as described with reference to FIG. 3.

In accordance with a data transfer instruction, at least a write threshold number of the EDSs within the first set of SUs that includes the first group of EDSs (e.g., EDSs 1_1, EDSs 2_1, EDSs 3_1, EDSs 4_1, and EDSs 5_1) get transferred via one or more DSN interfaces within network 24 to the second set of SUs based on a substantially same transfer rate and in substantial synchronization. Such a write threshold number (W) indicates a number of encoded data slices per set that must be accurately stored before the encoded data segment is deemed to have been properly stored. For example, consider that per data segment encoding values include: a pillar width of 5, a decode threshold of 3, a read threshold of 4, and a write threshold of 4. In such an example, any combination of at least 4 EDSs of the first group of EDSs (e.g., EDSs 1_1, EDSs 2_1, EDSs 3_1, EDSs 4_1, and EDSs 5_1) get transferred to the second set of SUs based on a substantially same transfer rate and in substantial synchronization via one or more DSN interfaces of network 24.

Also, in accordance with a data transfer instruction, at least the write threshold number of the EDSs within the second set of SUs that includes the second group of EDSs (e.g., EDSs 1_2, EDSs 2_2, EDSs 3_2, EDSs 4_2, and EDSs 5_2) get transferred via one or more DSN interfaces within network 24 to the second set of SUs based on a substantially same transfer rate and in substantial synchronization.

In some examples, such a transfer of data as described with reference to FIG. 9 is effectuated by a computing device. In an example of operation and implementation, a computing device includes an interface for interfacing with a dispersed storage network (DSN), a memory that stores operational instructions, and a processing module operably coupled to the interface and to the memory, wherein the processing module, when operable within the computing device based on the operational instructions, is configured to perform various operations. For example, the processing module is configured to detect a data transfer instruction that directs transfer of a plurality of sets of encoded data slices from a first set of storage units (SUs) to a second set of SUs via at least one of a plurality of DSN interfaces between the first set of SUs and the second set of SUs within the DSN.

In some examples, a data object is segmented into a plurality of data segments that includes a first data segment corresponding to a first row and a second data segment corresponding to a second row. In such an example, the first data segment is dispersed error encoded to produce a first row of encoded data slices, a read threshold number of the first row of encoded data slices provides for reconstruction of the first data segment, and a write threshold number of the first row of encoded data slices provides for a successful transfer of the first row of encoded data slices, and the second data segment is dispersed error encoded to produce a second row of encoded data slices, the read threshold number of the second row of encoded data slices provides for reconstruction of the second data segment, and the write threshold number of the second row of encoded data slices provides for the successful transfer of the first row of encoded data slices.

Also, in some examples, the first row of encoded data slices is distributedly stored in the first set of SUs such that a first encoded data slice of the first row of encoded data slices is stored in a first SU of the first set of SUs, and a second encoded data slice of the first row of encoded data slices is stored in a second SU of the first set of SUs, and the second row of encoded data slices is distributedly stored in the first set of SUs such that a first encoded data slice of the second row of encoded data slices is stored in the first SU of the first set of SUs, and a second encoded data slice of the second row of encoded data slices is stored in the second SU of the first set of SUs.

The processing module is also configured to determine a data transfer synchronization protocol that substantially maintains synchronization of at least the write threshold number of the first row of encoded data slices to be transferred from the first set of SUs to the second set of SUs based on a substantially same first transfer rate and substantially maintains synchronization of at least the write threshold number of the second row of encoded data slices to be transferred from the first set of SUs to the second set of SUs based on a substantially same second transfer rate. Also, the processing module is configured to execute the data transfer synchronization protocol to perform substantially synchronized transfer of respective sets of the plurality of sets of encoded data slices from the first set of SUs to the second set of SUs including to perform substantially synchronized transfer of a first set of the plurality of sets of encoded data slices during a first time based on the substantially same first transfer rate and to perform substantially synchronized transfer of a second set of the plurality of sets of encoded data slices during a second time based on the substantially same second transfer rate.

Also, in some examples of operation and interpretation, the processing module is configured to identify a plurality of EDSs for transfer with one or more storage entities (e.g., external entities such as SUs that are remotely located with respect to the computing device. This identification may be performed by interpreting a transfer request and identifying another storage location based on updated system configuration information.

For each EDS of the EDSs to be transferred, the processing module operates to identify a transfer type (e.g., storage/retrieval to store or retrieve data object, a retrieval to generate a rebuilt EDS, transfer due to a system configuration change). This identification may be performed by interpreting a request and detected the updated system configuration information.

Then, the processing module operates to determine status of a plurality of DSN interfaces that provide connectivity between the current SU(s) to one or more other SU(s) (e.g., the DSN interfaces that provide connectivity to the one or more external entities. This determination may be performed by interpreting a test result, interpreting an error message, interpreting a query response, identifying a loading level, identifying a capacity level, interpreting interface/connectivity configuration information (e.g., such as from system registry information, from a connectivity test result).

The, for EDSs to be transferred that are associated with a common transfer type, the processing module operates to select one or more DSN interfaces based on one or more of the transfer type, a priority level associated with the transfer type, and the status of the plurality of interfaces. For example, the processing module may operate to identify candidate interfaces associated with required connectivity (e.g., WAN-based DSN interface vs. LAN-based DSN interface, fiber-optic-based DSN interface vs. Ethernet-based DSN interface, etc.), and then operate to determine an estimated connectivity resource loading level, and assign transfer to an interface with sufficient capacity in accordance with a priority associated with the transfer type. For example, the processing module may operate to load a particular DSN interface more aggressively when that DSN interface is associated with a higher priority such as EDS rebuilding or EDS retrieval to regenerate a store data object. Alternatively, the processing module may operate to assign a lower priority for EDS transfer to another particular DSN interface due to the updated system configuration information.

Then, the processing module operates to facilitate data transfer of the EDSs slices associated with the common transfer type utilizing the selected one or more interfaces. For example, the processing module may operate to establish a connection via each selected DSN interface with a corresponding external entity, and the processing module may then operate to initiate EDS transfer over the established connection(s) and/or DSN interface(s).

Figure 10:
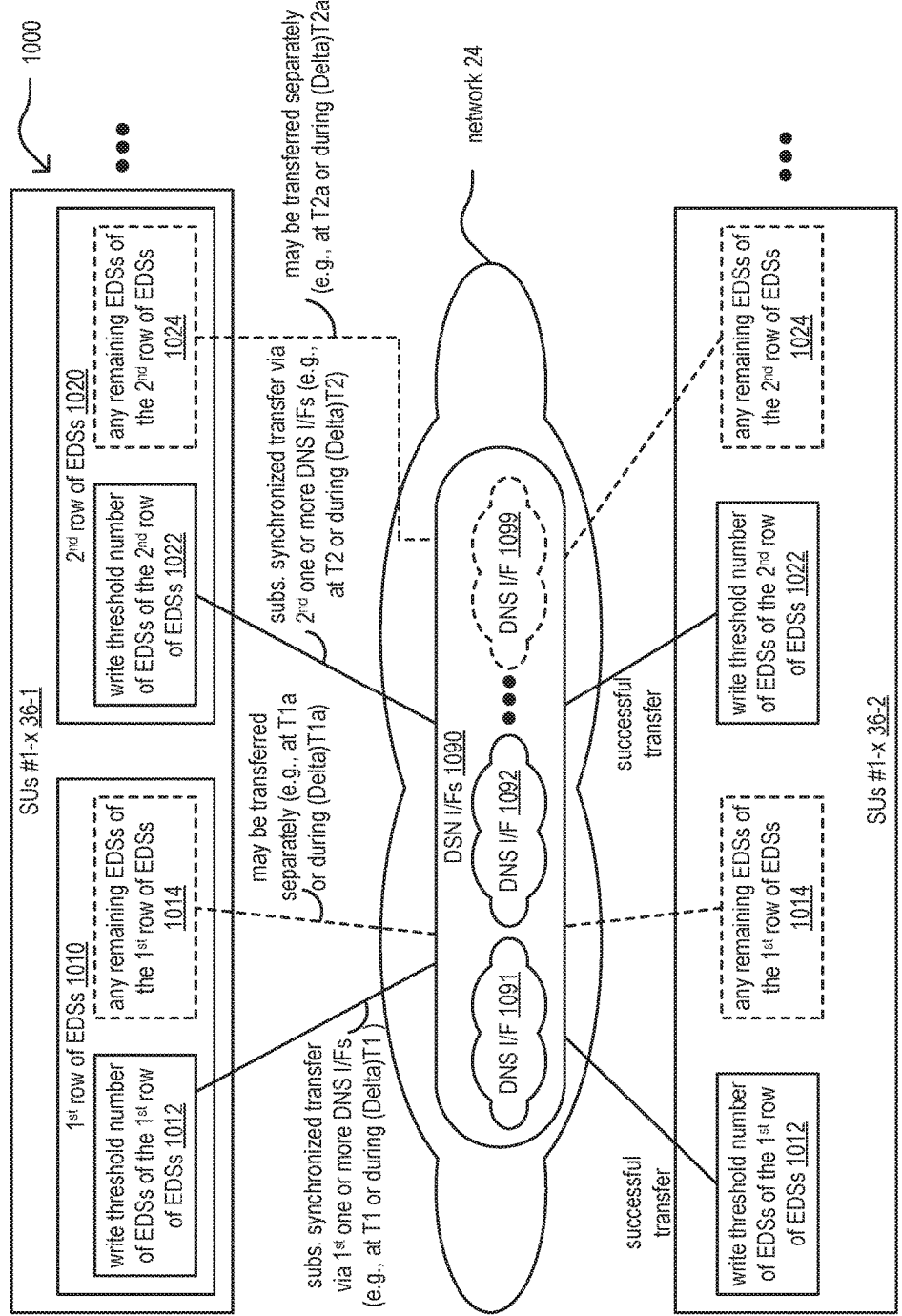
FIG. 10 is a schematic block diagram of another example of transfer of data from a first set of SUs to another set of SUs in accordance with the present invention.

FIG. 10 is a schematic block diagram of another example 1000 of transfer of data from a first set of SUs to another set of SUs in accordance with the present invention. Consider a first row of EDSs 1010 that are to be transferred from a first set of SUs #1-x 36-1, where x is a positive integer greater than or equal to 2, to a second set of SUs #1-2 36-2, and a second row of EDSs 1020 that are to be transferred from the first set of SUs #1-x 36-1 to the second set of SUs #1-2 36-2. The first row of EDSs 1010 may be stored in the first set of SUs #1-x in any manner (e.g., all in a first SU of the first set of SUs #1-x, distributed among the first set of SUs #1-x based on any manner, etc.). In addition, the second row of EDSs 1020 may be stored in the second set of SUs #1-x in any manner (e.g., all in a first SU of the first set of SUs #1-x, distributed among the first set of SUs #1-x based on any manner, etc.).

At least a write threshold number of the EDSs within the first row of EDSs 1012 get transferred via one or more DSN interfaces 1090 (e.g., any combination of the DSN interfaces 1090 that include DSN interface 1091, DSN interface 1092, and so on optionally up to DSN interface 1099) within network 24 to the second set of SUs based on a substantially same transfer rate and in substantial synchronization.

Also, at least the write threshold number of the EDSs within the second row of EDSs 1022 get transferred via the one or more DSN interfaces 1090 (e.g., can be used based on any combination of the DSN interfaces 1090 that include DSN interface 1091, DSN interface 1092, and so on optionally up to DSN interface 1099) within network 24 to the second set of SUs based on a substantially same transfer rate and in substantial synchronization.

In some examples, the at least a write threshold number of the EDSs within the first row of EDSs 1012 get transferred based on a first substantially synchronized transfer via a first one or more of the DSN interfaces 1090 and also at or during a first time (e.g., at T1 or during ΔT1). A successful transfer is deemed when the at least a write threshold number of the EDSs within the first row of EDSs 1012 get transferred.

Also, at least a write threshold number of the EDSs within the second row of EDSs 1022 get transferred based on a second substantially synchronized transfer via a second one or more of the DSN interfaces 1090 and also at or during a second time (e.g., at T2 or during ΔT2).

As can be seen, the at least the write threshold number of the EDSs within the second set of SUs can be transferred at a different time that the at least the write threshold number of the EDSs within the first set of SUs get transferred, and they can be transferred using a different one or more DSN interfaces within network 24 and/or a different substantially same transfer rate. For example, the at least the write threshold number of the EDSs within the first set of SUs may be transferred at or during a first time and based on a first substantially same transfer rate and in substantial synchronization with each other, while the at least the write threshold number of the EDSs within the second set of SUs may be transferred at or during a second time and based on a second substantially same transfer rate and in substantial synchronization with each other.

Note that any EDS within the at least the write threshold number of the EDSs within the first set of SUs that do not get transferred with the those of the at least the write threshold number of the EDSs of the first group of EDSs and/or the second group of EDSs that do get transferred with the at least the write threshold number of the EDSs may be transferred at any other time. For example, any remaining EDSs of the first row of the EDS 1014 within the first row of EDSs 1012 may be transferred at or during a different time than the first time (e.g., at T1a or during ΔT1a). Also, any remaining EDSs of the second row of the EDS 1024 within the second row of EDSs 1020 may be transferred at or during a different time than the second time (e.g., at T2a or during ΔT2a).

Alternatively, when possible, all of the EDSs within the first set of SUs that includes the first group of EDSs (e.g., first row of EDSs 1010) and/or all of the EDSs within the second set of SUs that includes the second group of EDSs (e.g., second row of EDSs 1020) may be transferred based on a substantially same transfer rate and in substantial synchronization with each other.

Figure 11:
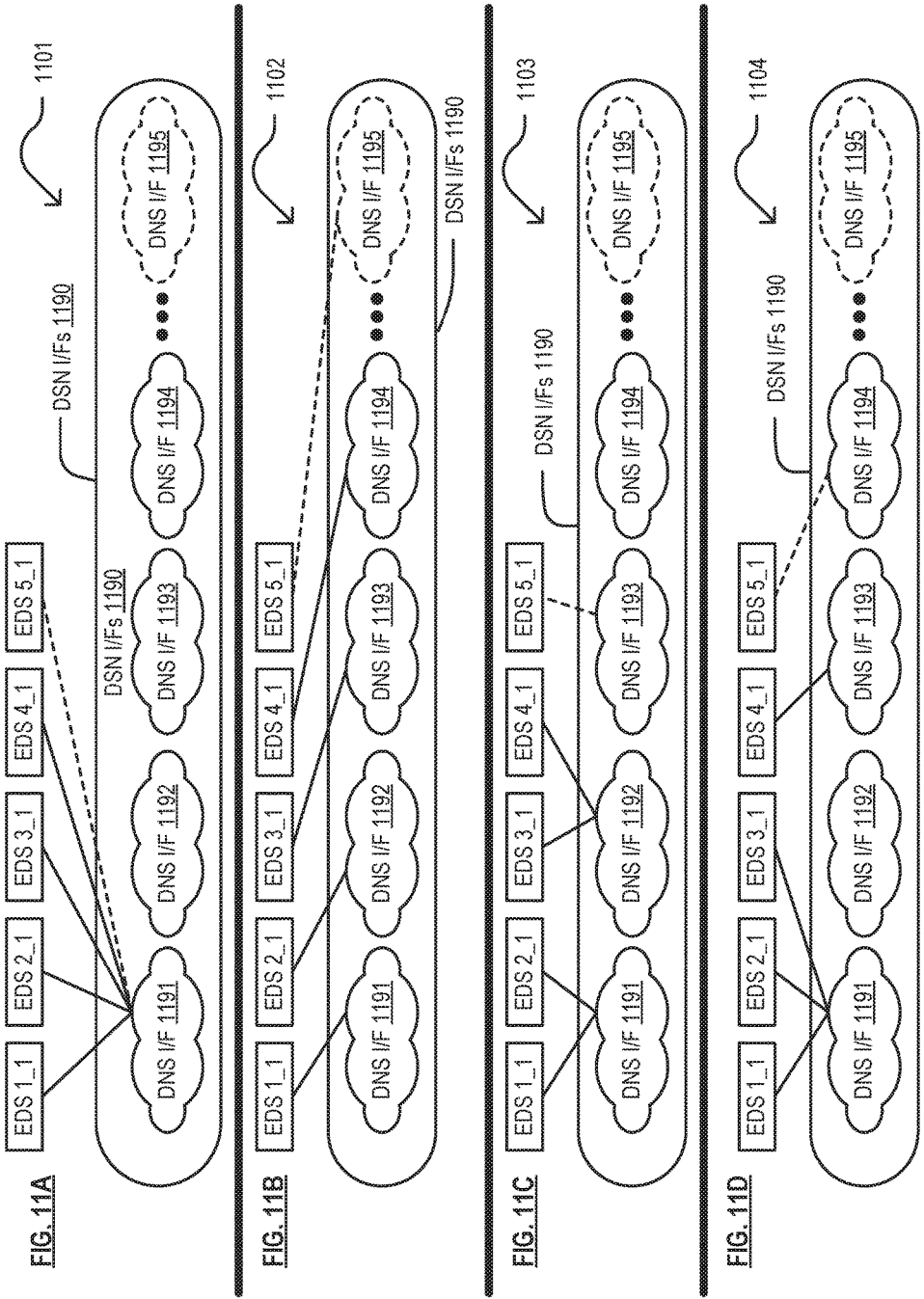
FIG. 11A is a schematic block diagram of an example of transfer of data from a first set of storage units (SUs) to another set of SUs (not shown) using a selected dispersed storage network (DSN) interface selected from a group of DSN interfaces in accordance with the present invention.
FIG. 11B is a schematic block diagram of an example of transfer of data from a first set of SUs to another set of SUs (not shown) using multiple selected DSN interfaces from a group of DSN interfaces in accordance with the present invention.
FIG. 11C is a schematic block diagram of another example of transfer of data from a first set of SUs to another set of SUs (not shown) using different multiple selected DSN interfaces from a group of DSN interfaces in accordance with the present invention.
FIG. 11D is a schematic block diagram of another example of transfer of data from a first set of SUs to another set of SUs (not shown) using another group of selected DSN interfaces from a group of DSN interfaces in accordance with the present invention.

FIG. 11A is a schematic block diagram of an example 1101 of transfer of data from a first set of storage units (SUs) to another set of SUs (not shown) using a selected dispersed storage network (DSN) interface selected from a group of DSN interfaces in accordance with the present invention. In this diagram, at least a write threshold number of EDS within a set of EDSs (e.g., such as corresponding to a first row of EDSs, such as may be shown as EDS 1_1 through 1_5) get transferred based via a first DSN interface 1191 of a number of DSN interfaces 1090.

For example, the DSN interfaces 1090 may include first DSN interface 1191, a second DSN interface 1192, a third DSN interface 1193, a fourth DSN interface 1194, and optionally up to an n-th DSN interface 1195. The at least a write threshold number of EDS within a set of EDSs may be transferred based on a substantially synchronized transfer. The DSN interfaces 1090 may include any number of interfaces and any number of different types of interfaces. Examples of such interfaces may include any one or more of a wireless local area network (WLAN) interface, a local area network (LAN) interface, a wired interface, a satellite interface, a wireless interface, a fiber-optic interface, and/or a mobile interface, among any other types of interfaces that may be included within the DSN interfaces 1090.

FIG. 11B is a schematic block diagram of an example 1102 of transfer of data from a first set of SUs to another set of SUs (not shown) using multiple selected DSN interfaces from a group of DSN interfaces in accordance with the present invention. In this diagram, at least a write threshold number of EDS within a set of EDSs (e.g., such as corresponding to a first row of EDSs) get transferred based via multiples respective DSN interfaces of the number of DSN interfaces 1090. For example, a first EDS 1_1 gets transferred via a first DSN interface 1191, a second EDS 2_1 gets transferred via a second DSN interface 1192, a third EDS 3_1 gets transferred via a third DSN interface 1193, and a fourth EDS 4_1 gets transferred via a fourth DSN interface 1194. Note that the EDSs 1_1 through 4_1 may get transferred based on a substantially same first transfer rate and while maintaining substantial synchronization with one another at or during the transfer. A fifth EDS 5_1 optionally gets transferred via a fifth DSN interface 1195 based on a substantially synchronized transfer with the other EDSs 1_1 through 4_1.

FIG. 11C is a schematic block diagram of another example 1103 of transfer of data from a first set of SUs to another set of SUs (not shown) using different multiple selected DSN interfaces from a group of DSN interfaces in accordance with the present invention. In this diagram, at least a write threshold number of EDS within a set of EDSs (e.g., such as corresponding to a first row of EDSs) get transferred based via multiples respective DSN interfaces of the number of DSN interfaces 1090, but in a different manner than they get transferred in FIG. 11B. For example, a first EDS 1_1 and a second EDS 2_1 get transferred via a first DSN interface 1191, a third EDS 3_1 and a fourth EDS 4_1 get transferred via a second DSN interface 1192. Note that the EDSs 1_1 through 4_1 may get transferred based on a substantially same first transfer rate and while maintaining substantial synchronization with one another at or during the transfer. A fifth EDS 5_1 optionally gets transferred via a third DSN interface 1193 based on a substantially synchronized transfer with the other EDSs 1_1 through 4_1.

FIG. 11D is a schematic block diagram of another example 1104 of transfer of data from a first set of SUs to another set of SUs (not shown) using another group of selected DSN interfaces from a group of DSN interfaces in accordance with the present invention. In this diagram, at least a write threshold number of EDS within a set of EDSs (e.g., such as corresponding to a first row of EDSs) get transferred based via multiples respective DSN interfaces of the number of DSN interfaces 1090, but in a different manner than they get transferred in FIG. 11B and FIG. 11C. For example, a first EDS 1_1, a second EDS 2_1, and a third EDS 3_1 get transferred via a first DSN interface 1191, a fourth EDS 4_1 get transferred via a third DSN interface 1193. Note that the EDSs 1_1 through 4_1 may get transferred based on a substantially same first transfer rate and while maintaining substantial synchronization with one another at or during the transfer. A fifth EDS 5_1 optionally gets transferred via a fourth DSN interface 1194 based on a substantially synchronized transfer with the other EDSs 1_1 through 4_1.

With respect to the various examples in the prior diagrams, note that any combination of EDS of a particular group (e.g., row of EDSs) may get transferred via any desired combination of the DSN interfaces 1090. Also, while certain examples show EDSs 1_1 through 4_1 or a set of EDSs 1_1 through 5_1 as being a write threshold number of EDS. However, any particular subset or combination of the set of EDSs 1_1 through 5_1 that corresponds to a write threshold number of EDS (e.g., 4 EDSs within a set of 5 EDSs) may constitute the write threshold number of EDS.

Figure 12:
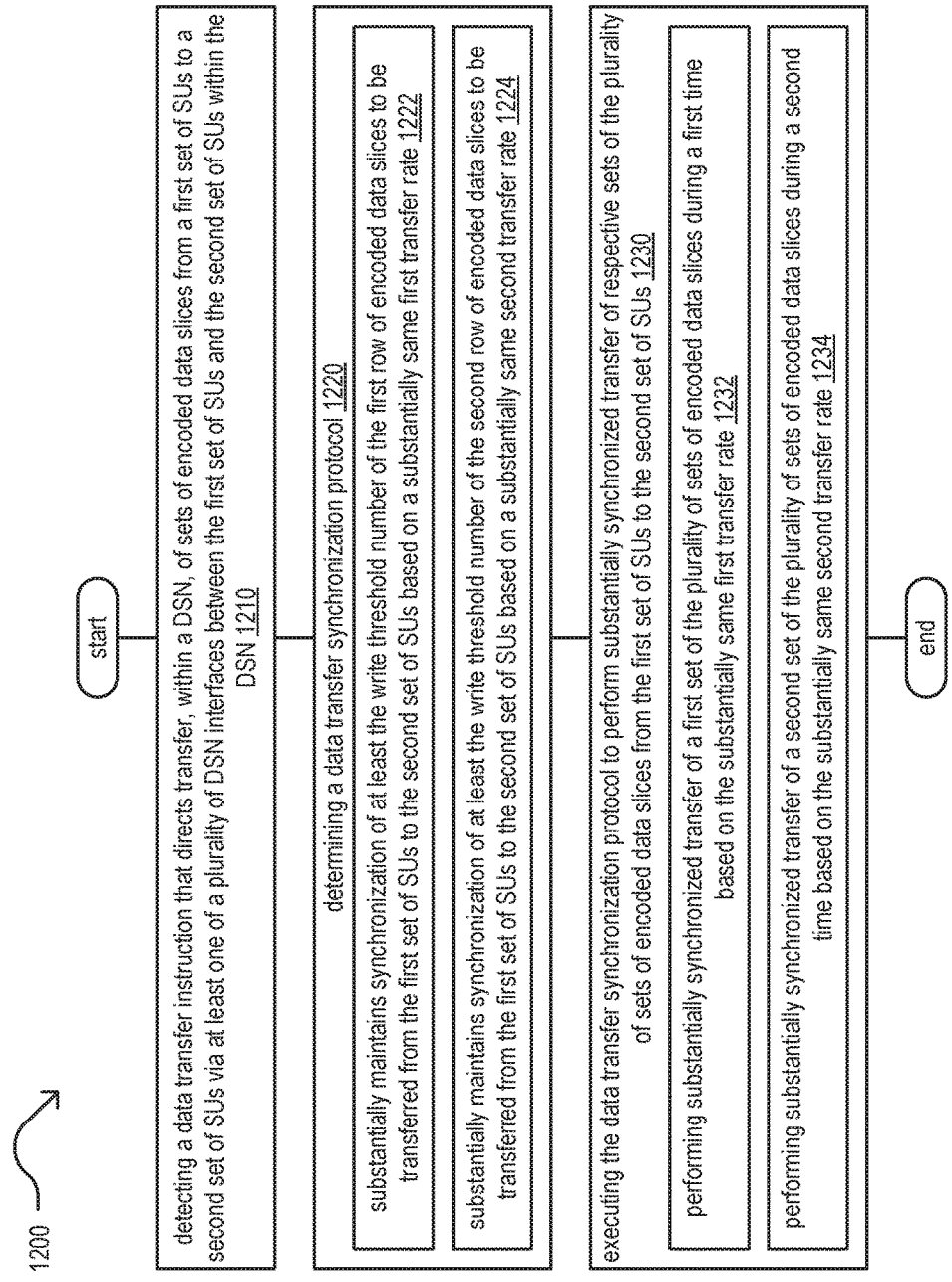
FIG. 12 is a diagram illustrating an embodiment of a method for execution by one or more computing devices.

FIG. 12 is a diagram illustrating an embodiment of a method 1200 for execution by one or more computing devices. The method 1200 begins by detecting a data transfer instruction that directs transfer, within a dispersed storage network (DSN), of sets of encoded data slices from a first set of storage units (SUs) to a second set of SUs via at least one DSN interface of a plurality of DSN interfaces between the first set of SUs and the second set of SUs within the DSN (block 1210).

In some examples, note that a data object is segmented into a plurality of data segments that includes a first data segment corresponding to a first row and a second data segment corresponding to a second row. Based on such characteristics, the first data segment is dispersed error encoded to produce a first row of encoded data slices, a read threshold number of the first row of encoded data slices provides for reconstruction of the first data segment, and a write threshold number of the first row of encoded data slices provides for a successful transfer of the first row of encoded data slices. Also, the second data segment is dispersed error encoded to produce a second row of encoded data slices, the read threshold number of the second row of encoded data slices provides for reconstruction of the second data segment, and the write threshold number of the second row of encoded data slices provides for the successful transfer of the first row of encoded data slices.

Also, is some implementations, the first row of encoded data slices is distributedly stored in the first set of SUs such that a first encoded data slice of the first row of encoded data slices is stored in a first SU of the first set of SUs, and a second encoded data slice of the first row of encoded data slices is stored in a second SU of the first set of SUs. Also, is some implementations, the second row of encoded data slices is distributedly stored in the first set of SUs such that a first encoded data slice of the second row of encoded data slices is stored in the first SU of the first set of SUs, and a second encoded data slice of the second row of encoded data slices is stored in the second SU of the first set of SUs.

The method 1200 continues by determining a data transfer synchronization protocol (block 1220). In some examples, the data transfer synchronization protocol substantially maintains synchronization of at least the write threshold number of the first row of encoded data slices to be transferred from the first set of SUs to the second set of SUs based on a substantially same first transfer rate (block 1222). Also, in some examples, the data transfer synchronization protocol substantially maintains synchronization of at least the write threshold number of the second row of encoded data slices to be transferred from the first set of SUs to the second set of SUs based on a substantially same second transfer rate (block 1224).

The method 1200 then operates by executing the data transfer synchronization protocol to perform substantially synchronized transfer of respective sets of the plurality of sets of encoded data slices from the first set of SUs to the second set of SUs (block 1230). Also, in some examples, this execution of the data transfer synchronization protocol involves performing substantially synchronized transfer of a first set of the plurality of sets of encoded data slices during a first time based on the substantially same first transfer rate (block 1232). Also, in some examples, this execution of the data transfer synchronization protocol also involves performing substantially synchronized transfer of a second set of the plurality of sets of encoded data slices during a second time based on the substantially same second transfer rate (block 1234).

In some examples and in alternative variants of the method 1200, the method 1200 may also include determining the data transfer synchronization protocol including to identify a first DSN interface of the plurality of DSN interfaces that substantially supports synchronized transfer of the at least the write threshold number of the first row of encoded data slices from the first set of SUs to the second set of SUs based on the substantially same first transfer rate. Then, the method 1200 may also involve executing the data transfer synchronization protocol to transfer perform substantially synchronized transfer of the at least the write threshold number of the first row of encoded data slices from the first set of SUs to the second set of SUs during the first time based on the substantially same first transfer rate via the first DSN interface. The method 1200 then operates by determining the data transfer synchronization protocol including to identify a second DSN interface of the plurality of DSN interfaces that substantially supports synchronized transfer of the at least the write threshold number of the second row of encoded data slices from the first set of SUs to the second set of SUs based on the substantially same second transfer rate, and executing the data transfer synchronization protocol to perform substantially synchronized transfer of the at least the write threshold number of the second row of encoded data slices from the first set of SUs to the second set of SUs during the second time based on the substantially same second transfer rate via the second DSN interface.

In some examples and in even other alternative variants of the method 1200, the method 1200 may also include determining the data transfer synchronization protocol including to identify a first DSN interface of the plurality of DSN interfaces to transfer the first encoded data slice of the first row of encoded data slices that is stored in the first SU of the first set of SUs to a first SU of the second set of SUs and to identify a second DSN interface of the plurality of DSN interfaces to transfer the second encoded data slice of the first row of encoded data slices that is stored in the second SU of the first set of SUs to a first SU of the second set of SUs such that the first DSN interface and the second DSN interface cooperatively support substantially synchronized transfer of the first encoded data slice and the second encoded data slice during the first time based on the substantially same first transfer rate. Then, the method 1200 operates by executing the data transfer synchronization protocol to perform substantially synchronized transfer of the first encoded data slice via the first DSN interface and transfer of the second encoded data slice via the second DSN interface during the first time based on the substantially same first transfer rate.

In even other examples and other alternative variants of the method 1200, the method 1200 involves receiving, from another computing device within the DSN and via an interface of the computing device, the data transfer instruction that directs transfer of the plurality of sets of encoded data slices from the first set of SUs to the second set of SUs via the at least one of the plurality of DSN interfaces between the first set of SUs and the second set of SUs within the DSN.

In yet other examples and other alternative variants of the method 1200, the method 1200 involves performing transfer of at least one remaining encoded data slice of the plurality of sets of encoded data slices after execution of the data transfer synchronization protocol when execution of the data transfer synchronization protocol includes fewer than all of the plurality of sets of encoded data slices.

Note that the computing device may be located at a first premises that is remotely located the first set of SUs and the second set of SUs within the DSN. Also, various examples of the DSN interfaces that may be used effectuate the transfer of EDSs between sets of SUs may include any one or more of a wireless local area network (WLAN) interface, a local area network (LAN) interface, a wired interface, a satellite interface, a wireless interface, a fiber-optic interface, and/or a mobile interface, among other types of communication interfaces that may be employed in various communication systems, networks, etc. Note also that the computing device may be of any of a number of types of devices including a wireless smart phone, a laptop, a tablet, a personal computers (PC), a work station, or a video game device, among other types of computing devices. Moreover, note that the DSN may be of any of a number of types of networks, communication systems, etc. including a wireless communication system, a wire lined communication systems, a non-public intranet system, a public internet system, a local area network (LAN), and/or a wide area network (WAN), among other types of networks, communication systems, etc.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A computing device comprising:
an interface for interfacing with a dispersed storage network (DSN);
memory that stores operational instructions; and
a processing module operably coupled to the interface and to the memory, wherein the processing module, when operable within the computing device based on the operational instructions, is configured to:
  detect a data transfer instruction that directs transfer of a plurality of sets of encoded data slices from a first set of storage units (SUs) to a second set of SUs via at least one of a plurality of DSN interfaces between the first set of SUs and the second set of SUs within the DSN, wherein:
    a data object is segmented into a plurality of data segments that includes a first data segment corresponding to a first row and a second data segment corresponding to a second row;
    the first data segment is dispersed error encoded to produce a first row of encoded data slices, a read threshold number of the first row of encoded data slices provides for reconstruction of the first data segment, and a write threshold number of the first row of encoded data slices provides for a successful transfer of the first row of encoded data slices;
    the second data segment is dispersed error encoded to produce a second row of encoded data slices, the read threshold number of the second row of encoded data slices provides for reconstruction of the second data segment, and the write threshold number of the second row of encoded data slices provides for the successful transfer of the first row of encoded data slices;
    the first row of encoded data slices is distributedly stored in the first set of SUs such that a first encoded data slice of the first row of encoded data slices is stored in a first SU of the first set of SUs, and a second encoded data slice of the first row of encoded data slices is stored in a second SU of the first set of SUs;
    the second row of encoded data slices is distributedly stored in the first set of SUs such that a first encoded data slice of the second row of encoded data slices is stored in the first SU of the first set of SUs, and a second encoded data slice of the second row of encoded data slices is stored in the second SU of the first set of SUs;
  determine a data transfer synchronization protocol that maintains synchronization of at least the write threshold number of the first row of encoded data slices to be transferred from the first set of SUs to the second set of SUs based on a same first transfer rate and maintains synchronization of at least the write threshold number of the second row of encoded data slices to be transferred from the first set of SUs to the second set of SUs based on a same second transfer rate; and
  execute the data transfer synchronization protocol to perform synchronized transfer of respective sets of the plurality of sets of encoded data slices from the first set of SUs to the second set of SUs including to perform synchronized transfer of a first set of the plurality of sets of encoded data slices during a first time based on the same first transfer rate and to perform synchronized transfer of a second set of the plurality of sets of encoded data slices during a second time based on the same second transfer rate.

2. The computing device of claim 1, wherein the processing module is further configured to:
  determine the data transfer synchronization protocol including to identify a first DSN interface of the plurality of DSN interfaces that supports synchronized transfer of the at least the write threshold number of the first row of encoded data slices from the first set of SUs to the second set of SUs based on the same first transfer rate;
  execute the data transfer synchronization protocol to transfer perform synchronized transfer of the at least the write threshold number of the first row of encoded data slices from the first set of SUs to the second set of SUs during the first time based on the same first transfer rate via the first DSN interface;
  determine the data transfer synchronization protocol including to identify a second DSN interface of the plurality of DSN interfaces that supports synchronized transfer of the at least the write threshold number of the second row of encoded data slices from the first set of SUs to the second set of SUs based on the same second transfer rate; and
  execute the data transfer synchronization protocol to perform synchronized transfer of the at least the write threshold number of the second row of encoded data slices from the first set of SUs to the second set of SUs during the second time based on the same second transfer rate via the second DSN interface.

3. The computing device of claim 1, wherein the processing module is further configured to:
  determine the data transfer synchronization protocol including to identify a first DSN interface of the plurality of DSN interfaces to transfer the first encoded data slice of the first row of encoded data slices that is stored in the first SU of the first set of SUs to a first SU of the second set of SUs and to identify a second DSN interface of the plurality of DSN interfaces to transfer the second encoded data slice of the first row of encoded data slices that is stored in the second SU of the first set of SUs to a first SU of the second set of SUs such that the first DSN interface and the second DSN interface cooperatively support synchronized transfer of the first encoded data slice and the second encoded data slice during the first time based on the same first transfer rate; and
  execute the data transfer synchronization protocol to perform synchronized transfer of the first encoded data slice via the first DSN interface and transfer of the second encoded data slice via the second DSN interface during the first time based on the same first transfer rate.

4. The computing device of claim 1, wherein the processing module is further configured to:
  receive, from another computing device within the DSN, the data transfer instruction that directs transfer of the plurality of sets of encoded data slices from the first set of SUs to the second set of SUs via the at least one of the plurality of DSN interfaces between the first set of SUs and the second set of SUs within the DSN.

5. The computing device of claim 1, wherein the processing module is further configured to:
  when execution of the data transfer synchronization protocol includes fewer than all of the plurality of sets of encoded data slices, perform transfer of at least one remaining encoded data slice of the plurality of sets of encoded data slices after execution of the data transfer synchronization protocol.

6. The computing device of claim 1, wherein the computing device is located at a first premises that is remotely located the first set of SUs and the second set of SUs within the DSN.

7. The computing device of claim 1, wherein the plurality of DSN interfaces includes at least one of a wireless local area network (WLAN) interface, a local area network (LAN) interface, a wired interface, a satellite interface, a wireless interface, a fiber-optic interface, or a mobile interface.

8. The computing device of claim 1, wherein the computing device includes a wireless smart phone, a laptop, a tablet, a personal computers (PC), a work station, or a video game device.

9. The computing device of claim 1, wherein the DSN includes at least one of a wireless communication system, a wire lined communication system, a non-public intranet system, a public internet system, a local area network (LAN), or a wide area network (WAN).

10. A method for execution by a computing device, the method comprising:
- detecting a data transfer instruction that directs transfer, within a dispersed storage network (DSN), of a plurality of sets of encoded data slices from a first set of storage units (SUs) to a second set of SUs via at least one of a plurality of DSN interfaces between the first set of SUs and the second set of SUs within the DSN, wherein:
  - a data object is segmented into a plurality of data segments that includes a first data segment corresponding to a first row and a second data segment corresponding to a second row;
  - the first data segment is dispersed error encoded to produce a first row of encoded data slices, a read threshold number of the first row of encoded data slices provides for reconstruction of the first data segment, and a write threshold number of the first row of encoded data slices provides for a successful transfer of the first row of encoded data slices;
  - the second data segment is dispersed error encoded to produce a second row of encoded data slices, the read threshold number of the second row of encoded data slices provides for reconstruction of the second data segment, and the write threshold number of the second row of encoded data slices provides for the successful transfer of the first row of encoded data slices;
  - the first row of encoded data slices is distributedly stored in the first set of SUs such that a first encoded data slice of the first row of encoded data slices is stored in a first SU of the first set of SUs, and a second encoded data slice of the first row of encoded data slices is stored in a second SU of the first set of SUs;
  - the second row of encoded data slices is distributedly stored in the first set of SUs such that a first encoded data slice of the second row of encoded data slices is stored in the first SU of the first set of SUs, and a second encoded data slice of the second row of encoded data slices is stored in the second SU of the first set of SUs;
- determining a data transfer synchronization protocol that maintains synchronization of at least the write threshold number of the first row of encoded data slices to be transferred from the first set of SUs to the second set of SUs based on a same first transfer rate and maintains synchronization of at least the write threshold number of the second row of encoded data slices to be transferred from the first set of SUs to the second set of SUs based on a same second transfer rate; and
- executing the data transfer synchronization protocol to perform synchronized transfer of respective sets of the plurality of sets of encoded data slices from the first set of SUs to the second set of SUs including performing synchronized transfer of a first set of the plurality of sets of encoded data slices during a first time based on the same first transfer rate and performing synchronized transfer of a second set of the plurality of sets of encoded data slices during a second time based on the same second transfer rate.

11. The method of claim 10 further comprising:
- determining the data transfer synchronization protocol including to identify a first DSN interface of the plurality of DSN interfaces that supports synchronized transfer of the at least the write threshold number of the first row of encoded data slices from the first set of SUs to the second set of SUs based on the same first transfer rate;
- executing the data transfer synchronization protocol to transfer perform synchronized transfer of the at least the write threshold number of the first row of encoded data slices from the first set of SUs to the second set of SUs during the first time based on the same first transfer rate via the first DSN interface;
- determining the data transfer synchronization protocol including to identify a second DSN interface of the plurality of DSN interfaces that supports synchronized transfer of the at least the write threshold number of the second row of encoded data slices from the first set of SUs to the second set of SUs based on the same second transfer rate; and
- executing the data transfer synchronization protocol to perform synchronized transfer of the at least the write threshold number of the second row of encoded data slices from the first set of SUs to the second set of SUs during the second time based on the same second transfer rate via the second DSN interface.

12. The method of claim 10 further comprising:
- determining the data transfer synchronization protocol including to identify a first DSN interface of the plurality of DSN interfaces to transfer the first encoded data slice of the first row of encoded data slices that is stored in the first SU of the first set of SUs to a first SU of the second set of SUs and to identify a second DSN interface of the plurality of DSN interfaces to transfer the second encoded data slice of the first row of encoded data slices that is stored in the second SU of the first set of SUs to a first SU of the second set of SUs such that the first DSN interface and the second DSN interface cooperatively support synchronized transfer of the first encoded data slice and the second encoded data slice during the first time based on the same first transfer rate; and
- executing the data transfer synchronization protocol to perform synchronized transfer of the first encoded data slice via the first DSN interface and transfer of the second encoded data slice via the second DSN interface during the first time based on the same first transfer rate.

13. The method of claim 10 further comprising:
receiving, from another computing device within the DSN and via an interface of the computing device, the data transfer instruction that directs transfer of the plurality of sets of encoded data slices from the first set of SUs to the second set of SUs via the at least one of the plurality of DSN interfaces between the first set of SUs and the second set of SUs within the DSN.

14. The method of claim 10 further comprising:
when execution of the data transfer synchronization protocol includes fewer than all of the plurality of sets of encoded data slices, performing transfer of at least one remaining encoded data slice of the plurality of sets of encoded data slices after execution of the data transfer synchronization protocol.

15. The method of claim 10, wherein the computing device is located at a first premises that is remotely located the first set of SUs and the second set of SUs within the DSN.

16. The method of claim 10, wherein the plurality of DSN interfaces includes at least one of a wireless local area network (WLAN) interface, a local area network (LAN) interface, a wired interface, a satellite interface, a wireless interface, a fiber-optic interface, or a mobile interface.

17. The method of claim 10, wherein the computing device includes a wireless smart phone, a laptop, a tablet, a personal computers (PC), a work station, or a video game device.

18. The method of claim 10, wherein the DSN includes at least one of a wireless communication system, a wire lined communication system, a non-public intranet system, a public internet system, a local area network (LAN), or a wide area network (WAN).

* * * * *